(12) United States Patent
Wang et al.

(10) Patent No.: US 6,424,223 B1
(45) Date of Patent: Jul. 23, 2002

(54) MMIC POWER AMPLIFIER WITH WIREBOND OUTPUT MATCHING CIRCUIT

(75) Inventors: Nanlei Larry Wang, Palo Alto; Shuo-Yuan Hsiao, Milpitas; Xiao-Peng Sun, Fremont, all of CA (US)

(73) Assignee: EiC Corporation, Fremont, CA (US)

( * ) Notice: Subject to any disclaimer, the term of this patent is extended or adjusted under 35 U.S.C. 154(b) by 0 days.

(21) Appl. No.: 09/765,996

(22) Filed: Jan. 19, 2001

(51) Int. Cl.[7] .................................................. H03F 3/60
(52) U.S. Cl. ......................................... 330/286; 330/302
(58) Field of Search ........................... 330/53, 67, 286, 330/302, 307; 333/32, 33, 247; 257/275

(56) References Cited

U.S. PATENT DOCUMENTS

| | | | | |
|---|---|---|---|---|
| 5,164,683 A | * | 11/1992 | Shields ........................ | 330/307 |
| 5,276,345 A | * | 1/1994 | Siegel et al. ................. | 257/352 |
| 5,352,991 A | * | 10/1994 | Lipschultz et al. ......... | 330/289 |
| 5,446,309 A | * | 8/1995 | Adachi et al. ............... | 257/528 |
| 5,696,466 A | * | 12/1997 | Li ............................... | 330/286 |
| 5,880,517 A | * | 3/1999 | Petrosky ...................... | 257/577 |
| 6,023,080 A | * | 2/2000 | Kojima ........................ | 257/275 |
| 6,054,900 A | * | 4/2000 | Ishida et al. ................. | 330/286 |
| 6,127,894 A | * | 10/2000 | Alderton ...................... | 330/286 |
| 6,169,301 B1 | * | 1/2001 | Ishikawa et al. ............ | 257/275 |
| 6,194,774 B1 | * | 2/2001 | Cheon ......................... | 257/531 |

* cited by examiner

Primary Examiner—Benny T. Lee
Assistant Examiner—Henry Choe
(74) Attorney, Agent, or Firm—Townsend and Townsend and Crew LLP; Henry K. Woodward

(57) ABSTRACT

A hybrid microwave and millimeter wave integrated circuit (MMIC) RF power amplifier includes an integrated circuit in which an amplifier circuit is fabricated and an output impedance matching network comprising metal-insulator-metal (MIM) capacitors mounted on the integrated circuit chip with bonding wire inductors connecting the amplifier circuit with the capacitor elements. The resulting structure has a smaller form factor as compared to conventional power amplifiers employing planar transmission lines and surface mount technology capacitors.

3 Claims, 3 Drawing Sheets

MMIC POWER AMPLIFIER WITH WIREBOND OUTPUT MATCHING CIRCUIT

BACKGROUND OF THE INVENTION

This invention relates generally to RF power amplifiers for wireless communications, and more particularly, the invention relates to microwave and millimeter wave integrated circuit (MMIC) power amplifiers having output impedance matching networks.

The trend of wireless communication equipment has led to an increasing demand for high performance and small form factor electronic components. In the modern wireless application, the radio frequency (RF) power amplifier circuit is one of the largest components in the transceiver portion of the phone. Thus the reduction of its size has been targeted in the industry.

The microwave and millimeter wave integrated circuit (MMIC) power amplifier is typically impedance matched to 50 ohms at both the input and output. While the amplifier is usually operated at 10 GHz and above, the output matching circuit at lower frequencies becomes lossy. The output network of a MMIC circuit uses metal-insulator-metal (MIM) capacitors and metal traces on the surface of the semiconductor substrate as the transmission line. The losses in the transmission line increase per unit electrical length as frequency is lowered. Therefore the loss of the output matching circuit for RF and low microwave frequency is intolerable. Thus while the MMIC power amplifier offers small size, the losses in the impedance matching network make it impractical at low microwave frequencies.

To improve RF performance while maintaining a small form factor, a power amplifier module (PAM) is used. FIG. 1 is a block diagram of a conventional power amplifier module for RF/low microwave frequency applications. The module includes a power amplifier integrated circuit (PAIC) 10 which is connected to a separate output matching circuit 12. As shown in FIG. 2, the output matching circuit typically comprises a planar transmission line (TL) or microstrip 14 and surface-mount-technology (SMT) capacitors 16 which are mounted on a ceramic or laminate substrate 18 along with the integrated circuit 10.

The PAIC integrated circuit is usually the full MMIC power amplifier less the lossy output matching circuit. To reduce the transmission line loss in the PAM, the line width of the TL must be increased which in turn requires longer physical length to maintain the original inductive effect. Therefore, the module size and TL loss become trade-offs in the PAM design. Compared with the transmission line on the MMIC power amplifier, the transmission line on a power amplifier module has much thicker metal (3 to 5 microns on the MMIC compared to 25–50 microns on the PAM substrate) and therefore offers much less loss. Another way to improve conversion loss is the use of high quality factor (Q) SMT capacitors. However, a commercial high quality capacitor is not cost effective and its Q is always lower than that available in the integrated circuit.

SUMMARY OF THE INVENTION

In accordance with the invention, an RF power amplifier includes an integrated circuit in which an amplifier circuit is fabricated and an output impedance matching circuit including at least one capacitor mounted on the integrated circuit substrate with bonding wire inductors connecting the amplifier circuit to the at least one capacitor. In a preferred embodiment, the capacitor is mounted on a major surface of the integrated circuit semiconductor body in a hybrid integrated circuit.

Preferably the one or more capacitors of the output impedance matching circuit comprise metal-insulator-metal (MIM) capacitors with wire bonding serially connecting the integrated circuit output and the capacitors. The length and height of the wire bonds can be selected to provide the requisite impedance for a particular operating frequency of the power amplifier.

The form factor of the power amplifier is reduced since the bond wire inductor occupies less chip surface area than the conventional transmission line inductor. Further, the wire bond inductor has lower loss than the planar transmission line, and multiple bonding wires can be used to further reduce the loss. The resulting hybrid power amplifier has the combined strength of the MMIC power amplifier and the PAM module in performance yet offers low-cost manufacturing through use of conventional semiconductor fabrication techniques.

The invention and object features thereof will be more readily apparent from he following detailed description and dependent claims when taken with the drawing.

DETAILED DESCRIPTION OF THE SPECIFIC EMBODIMENTS

Figure 1:
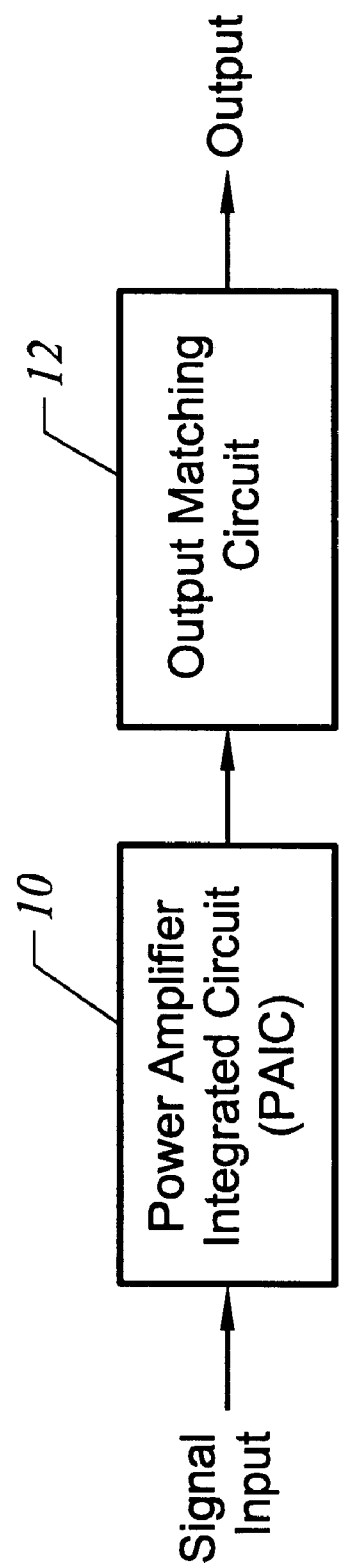
FIG. 1 is a functional block diagram of a power amplifier circuit.
Figure 2:
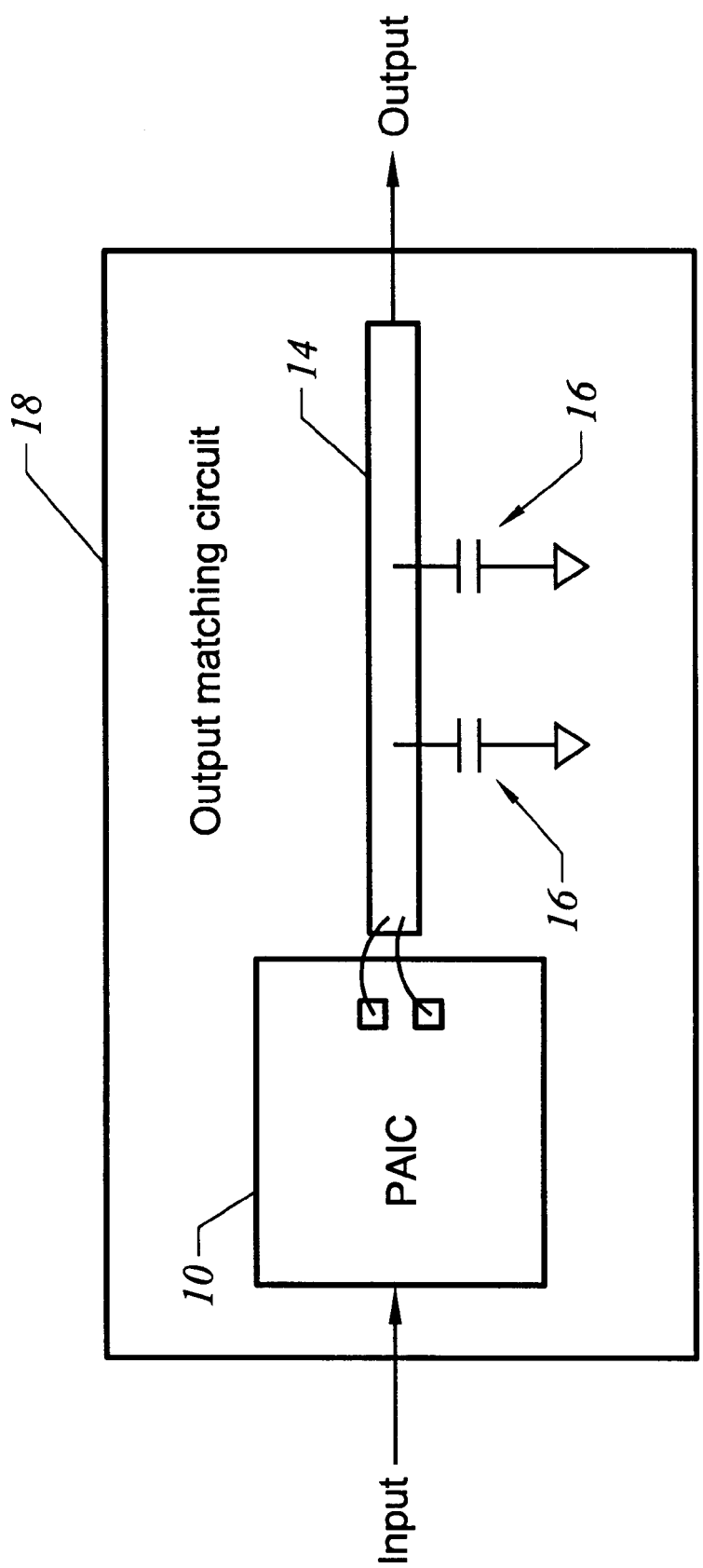
FIG. 2 is a functional block diagram of a power amplifier module.
Figure 3:
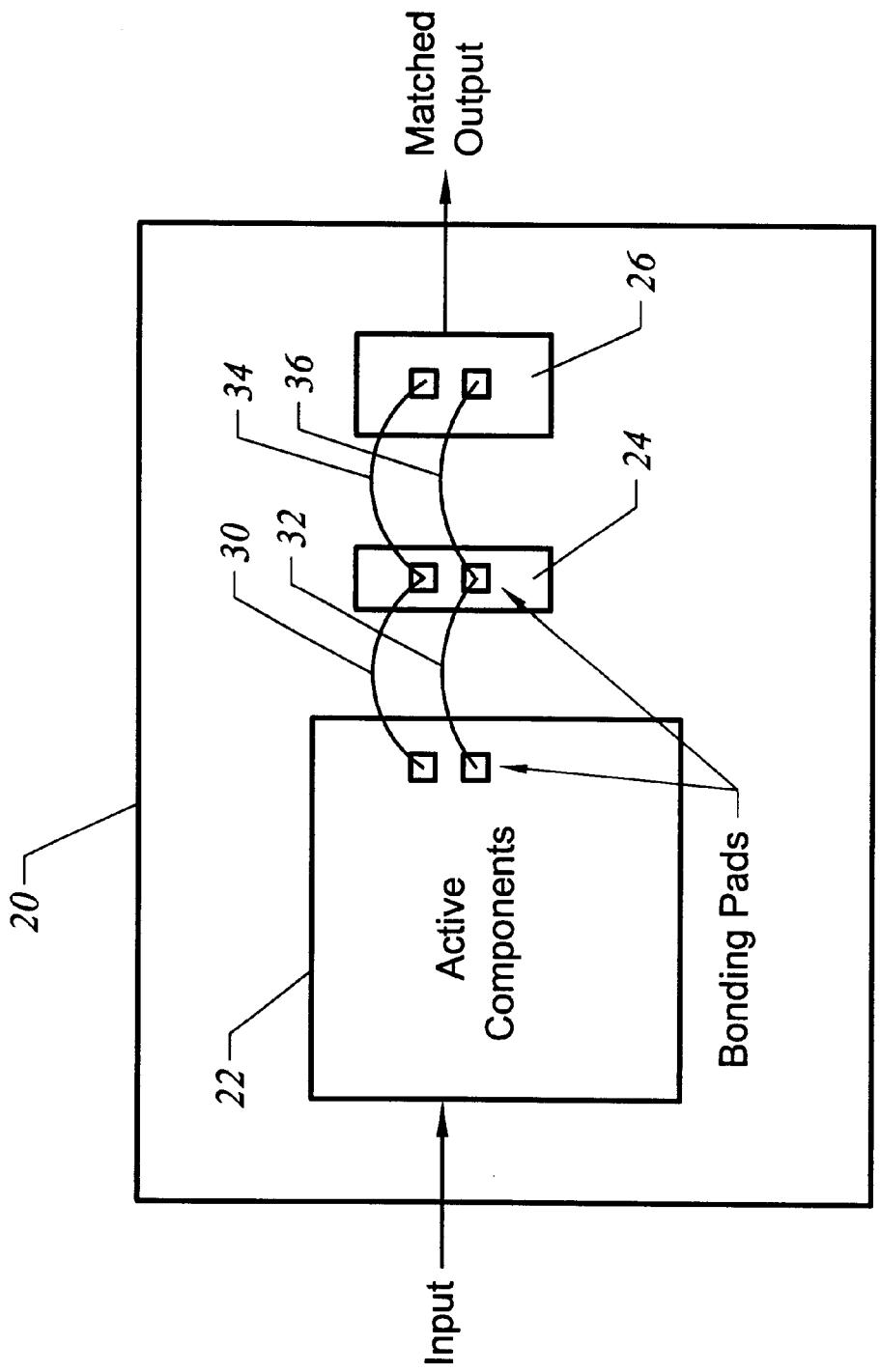
FIG. 3 is a function block diagram of a power amplifier with wirebond output matching circuit in accordance with the invention.

Referring now to FIG. 3, an embodiment of the present invention includes a semiconductor body 20 having a major surface in which the active components of a power amplifier 22 are fabricated. Mounted on the major surface of semiconductor body 20 are MIM capacitors 24, 26 with bonding pads on the surfaces of capacitors 24, 26 connected to plates of the capacitors. The metal-insulator-metal capacitor is a conventional structure in semiconductor circuits and is conventionally manufactured using standard semiconductor processes of metal and insulator sequential depositions. Bonding pads are provided at the output of the power amplifier 22, and bonding wires 30 and 32 interconnect the output of the amplifier to bonding pads on capacitor 24. Similarly, wire bonds 34, 36 serially connect capacitors 24, 26 in a serial impedance matching circuit. The capacitance of the capacitors is readily established during manufacturing by controlling surface areas of the capacitor plates and insulator material and thicknesses. Similarly, the inductance of the bonding wires is readily controlled by the length of the wires. Importantly, surface area on semiconductor body 20 is preserved since the bonding wires can extend in a vertical direction without utilizing surface space on body 20. The MIM capacitors 24 and 26 can be either a "shunt" element with the other electrode grounded through a via hole to the backside ground of the semiconductor 20, or a "serial" element with the other electrode connected to a bond wire pad for further connection.

A representative sample of the power amplifier operates at 836 MHz cellular band. A shunt capacitor of 13 pF, and a bond wire of 1 mil diameter and approximately 2.7 mm length will make 4 ohm load impedance.

In accordance with the invention, the MIM capacitors are mounted directly on the integrated circuit substrate. Further, the MIM capacitor is much smaller than the surface-mount-technology (SMT) capacitor, and the bond wire inductor on the chip occupies less chip surface area than the conventional transmission line inductor. While SMT capacitors have values which are available only in 5 percent or 10 percent steps, the on-chip MIM capacitor can be designed to any desired value. The use of SMT capacitors also suffer from placement error during assembly. This error is undesirable because it leads to uncertainty in the transmission line electrical length. However, the placement of on-chip MIM capacitors is not critical due to the use of bonding wire inductances.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF power amplifier comprising
   a) an integrated circuit including a semiconductor body in which an amplifier circuit is fabricated,
   b) an output impedance matching circuit including a plurality of capacitors which are serially connected by bonding wire inductors and mounted on the semiconductor body with bonding wire inductors connecting the amplifier circuit to the capacitors, the plurality of capacitors comprising metal-insulator-metal (MIM) capacitors.

2. The RF power amplifier as defined by claim 1 wherein the amplifier is designed for microwave and millimeter wave frequency operation.

3. A hybrid microwave and millimeter wave integrated circuit (MMIC) RF power amplifier comprising:
   a) an integrated circuit including a semiconductor body having a major surface in which an amplifier circuit is fabricated, and
   b) an output impedance matching network circuit comprising an inductor-capacitor transmission line with a plurality of capacitors which are serially connected by wire bonding inductors and bonding wire connecting the plurality of capacitors to the amplifier circuit providing transmission line inductance, said plurality of capacitors being mounted on the major surface of the semiconductor body, the plurality of capacitors comprising a metal-insulator-metal (MIM) capacitors.

* * * * *